United States Patent
Sakaguchi

(10) Patent No.: US 7,164,326 B2
(45) Date of Patent: Jan. 16, 2007

(54) OSCILLATOR CIRCUIT

(75) Inventor: Makoto Sakaguchi, Shiga (JP)

(73) Assignee: NEC Electronics Corporation, Kanagawa (JP)

( * ) Notice: Subject to any disclaimer, the term of this patent is extended or adjusted under 35 U.S.C. 154(b) by 120 days.

(21) Appl. No.: 10/956,114

(22) Filed: Oct. 4, 2004

(65) Prior Publication Data
US 2005/0040899 A1    Feb. 24, 2005

(30) Foreign Application Priority Data
Oct. 7, 2003    (JP)    ............................ 2003-347951

(51) Int. Cl.
*H03B 5/00* (2006.01)

(52) U.S. Cl. ...................... 331/185; 331/111; 331/175; 331/74; 331/177 R

(58) Field of Classification Search ................ 331/111, 331/147, 74, 175, 177 R, 185
See application file for complete search history.

(56) References Cited

U.S. PATENT DOCUMENTS

| | | | |
|---|---|---|---|
| 5,638,031 A * | 6/1997 | Danstrom | .................... 331/111 |
| 5,831,486 A | 11/1998 | Wehbi | |
| 6,377,130 B1 | 4/2002 | Haman | |

FOREIGN PATENT DOCUMENTS

| | | |
|---|---|---|
| JP | 59-027611 A | 2/1984 |
| JP | H04-104505 A | 4/1992 |

OTHER PUBLICATIONS

*Low Power 430MHz HFM Oscillator with Disable* Nov. 14, 2002.

* cited by examiner

*Primary Examiner*—Arnold Kinkead
(74) *Attorney, Agent, or Firm*—Sughrue Mion, PLLC

(57) ABSTRACT

The oscillator circuit comprises an oscillator including an oscillating transistor through which an oscillating current flows; a first mirror transistor where the source/drain of which is grounded and the drain/source of which is connected to the oscillating transistor in series; a first reference transistor where the source/drain of which is grounded and the drain/source and the gate of which are connected in common to the gate of the first mirror transistor; a second mirror transistor where the source of which is connected to a power line and the drain/source of which is connected to the drain/source of the first reference transistor; and a second reference transistor where the source/drain of which is connected to the power line, the drain/source and the gate of which are connected in common to the gate of the second mirror transistor and the drain/source of which is connected to an external terminal to which an external resistor is connected. The oscillating current is adjusted by adjusting a current flow through the external resistor and the second reference transistor.

8 Claims, 1 Drawing Sheet

FIG. 2 PRIOR ART

OSCILLATOR CIRCUIT

This application is based on Japanese patent application NO. 2003-347951, the content of which is incorporated hereinto by reference.

BACKGROUND OF THE INVENTION

1. Field of the Invention

The present invention relates to an oscillator circuit outputting constant frequency, more specifically to an oscillator circuit capable of adjusting its frequency with an external resistor.

2. Description of the Related Art

Conventionally, an integrated oscillator circuit has been used to generate a signal with a required oscillating frequency in devices such as communication devices and central processing units (CPU). In order to obtain a desired frequency, a method of changing the value of external parts such as resistors attached to the IC has been used.

The conventional oscillator circuit 200 will be explained with reference to FIG. 2. The oscillator circuit 200 includes an operational amplifier A2, an oscillating transistor M6, an external resistance $R_O$, a first parasitic element P1, and a second parasitic element P2.

The operational amplifier A2 includes a non-inverting input terminal (+) to which a reference voltage Vref is applied. The oscillating transistor M6 is a N-channel-MOS-FET where the drain is connected to a power line Vcc, the gate is connected to an output of the operational amplifier A2 and the source is connected to the inverting input terminal (−) of the operational amplifier A2. The source of the operational amplifier A2 also serves as an output of the oscillator circuit 200.

One of the edges of the external resistor $R_O$ is connected to an external terminal T1 and the other of the edges thereof is grounded. The first parasitic element P1 includes, for example, a parasitic capacitance Cp1, a parasitic inductance Lp1 and a parasitic resistance Rp1 formed with a line connecting the source of the oscillating transistor M6 and the external terminal T1, bonding pads and bonding wires. The second parasitic element P2 includes, for example, a parasitic inductance Lp2 and a parasitic resistance Rp2 formed with a line connecting the ground line inside the IC and the grounded terminal GND, bonding pads and bonding wires.

The operation of the conventional oscillator circuit 200 will be explained in the followings. Firstly, the explanation will be made without the first parasitic elements P1 and the second parasitic elements P2 taken into consideration.

Generally, in an operational amplifier, when a signal passes through an amplifier circuit, a phase lag between an input signal and an out put signal occurs and sometimes the phase lag becomes 180 degree or more in the high frequency region. When the operational amplifier is used as a negative feedback circuit and the amplifier gain is greater than or equal to 0 dB and phase lag is 180 degree, a signal is fed back positively to the operational amplifier to cause an oscillation.

The principle operation of the oscillator circuit 200 is same as the above general operational amplifier. In the oscillator circuit 200, an output of a source follower composed of the oscillating transistor M6 and the external resistor $R_O$ connected to the operational amplifier A2 and the external resistor $R_O$ is fed back negatively to the inverting input terminal (−) of the operational amplifier A2. When the gain and the phase lag of the frequency of the total of the operational amplifier A2 and the source follower is greater than or equal to 0 dB and is 180 degree, respectively, the signal is fed back positively to the operational amplifier A2. Hence an oscillation occurs. In such the case, by decreasing the external resistance $R_O$, the oscillation frequency increases because the oscillation current flowing through the source follower increases. Conversely, by increasing the external resistance $R_O$, the oscillation frequency decreases, as described in EL6201 Data Sheet Nov. 14, 2002 FN7216, page 3, 8 and FIG. 3, URL:http://www.intersil.com/data/fn/fn7216.pdf.

Now, the impedances of the first parasitic elements P1 and the second parasitic elements P2 are taken into consideration. When the frequency is relatively low, the impedances of the first parasitic element P1 and the second parasitic elements P2 are relatively small compared with that of the external resistance $R_O$ and can be neglected. However, when the frequency becomes higher than 400 MHz for example, the impedances of the first parasitic element P1 and the second parasitic elements P2 cannot be neglected compared with that of the external resistance $R_O$. Therefore, especially when the frequency is higher than 400 MHz for example, the oscillation frequency is controlled by the impedances of the first parasitic element P1 and the second parasitic elements P2 rather than that of the external resistance $R_O$. Consequently, a problem arises that the upper limit of the oscillation frequency is restricted by the first parasitic element P1 and the second parasitic elements P2.

SUMMARY OF THE INVENTION

Considering the above mentioned problems, the present invention provides a new oscillation circuit in which the upper limit of the oscillation frequency is increased by reducing the effect of parasitic elements such as bonding wires on the oscillation frequency.

According to the present invention, there is provided an oscillator circuit comprising: an oscillator including an oscillating transistor through which an oscillating current flows; and a current mirror circuit via which the oscillating current is adjusted by an external resistor to adjust an oscillating frequency of the oscillator.

According to the present invention, there is provided an oscillator including an oscillating transistor through which an oscillating current flows; a first mirror transistor where the source/drain of which is grounded and the drain/source of which is connected to the oscillating transistor in series; a first reference transistor where the source/drain of which is grounded and the drain/source and the gate of which are connected in common to the gate of the first mirror transistor; a second mirror transistor where the source of which is connected to a power line and the drain/source of which is connected to the drain/source of the first reference transistor; and a second reference transistor where the source/drain of which is connected to the power line, the drain/source and the gate of which are connected in common to the gate of the second mirror transistor and the drain/source of which is connected to an external terminal to which an external resistor is connected; wherein the oscillating current is adjusted by adjusting a current flow through the external resistor and the second reference transistor.

According to the oscillator circuit of the present invention, the oscillating current output from the oscillating transistor is adjusted by the external resistor via the current mirror circuit such that the oscillating current does not directly flow through the external resistor. It means that the oscillating current does not flow directly through the parasitic elements such as bonding wires. Therefore, the impedances in the parasitic elements do not increase and the upper limit of the oscillation frequency can be increased.

BRIEF DESCRIPTION OF THE DRAWINGS

The above and other objects, advantages and features of the present invention will be more apparent from the following description taken in conjunction with the accompanying drawings, in which:

FIG. 2 shows a structure of a conventional oscillator circuit.

DETAILED DESCRIPTION OF THE PREFERRED EMBODIMENTS

In the present invention, the oscillator circuit includes a transistor, which is a part of a current mirror circuit, and uses the transistor for adjusting the frequency of the oscillator circuit instead of directly adjusting the frequency of the oscillator circuit with the external resistor $R_0$.

Figure 1:
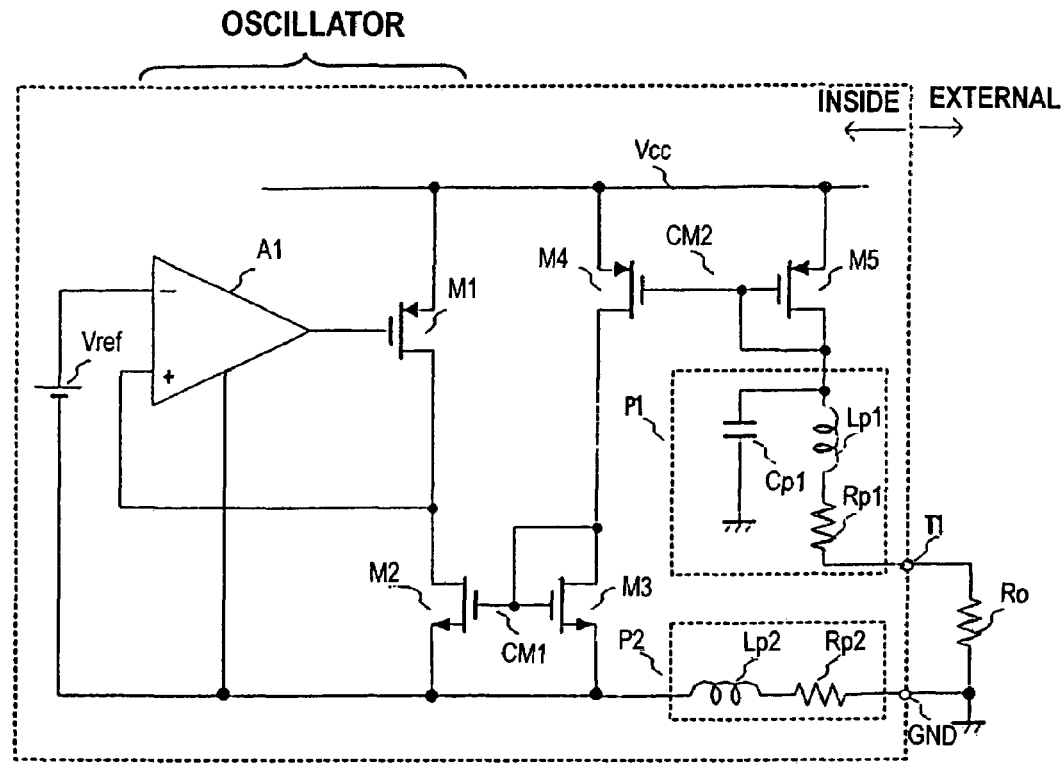
FIG. 1 shows a structure of an oscillator circuit of the present embodiment.
Figure 1:
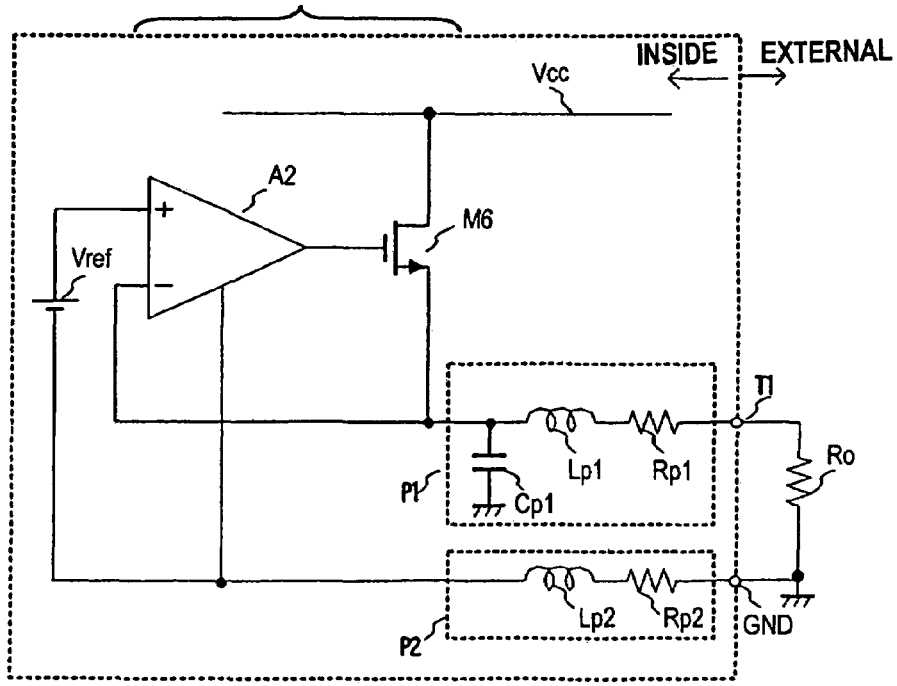

The oscillator circuit 100 of the present embodiment will be explained with reference to FIG. 1. The oscillator circuit 100 includes an operational amplifier A1, an oscillating transistor M1, a first current mirror circuit CM1 constructed with a first mirror transistor M2 and a first reference transistor M3, a second current mirror circuit CM2 constructed with a second mirror transistor M4 and a second reference transistor M5, an external resistance $R_0$, a first parasitic element P1, and a second parasitic element P2.

The operational amplifier A1 includes an inverting input terminal (−) to which a reference voltage Vref is applied. The oscillating transistor M1 is a P-channel-MOSFET where the source is connected to a power line Vcc and the gate is connected to an output of the operational amplifier A1.

The source of the first mirror transistor M2 is grounded and the drain of which is connected to the drain of the oscillating transistor M1 and to a non-inverting input (+) of the operational amplifier A1. The drain of the oscillating transistor M1 also serves as an output of the oscillator circuit 100. The source of the first reference transistor M3 is grounded and the drain and the gate of which are connected with each other and connected to the gate of the first mirror transistor M2. Thus, the first mirror transistor M2 and the first reference transistor M3 construct the first current mirror circuit CM1.

The source of the second mirror transistor M4 is connected to the power line Vcc and the drain of which is connected to the drain of the first reference transistor M3. The source of the second reference transistor M5 is connected to the power line Vcc and the drain and the gate of which are connected with each other and connected to the gate of the second mirror transistor M4. Thus, the second mirror transistor M4 and the second reference transistor M5 construct the second current mirror circuit CM2.

One of the edges of the external resistance $R_0$ is connected to an external terminal T1 and the other of the edges is connected to a grounded terminal GND.

The first parasitic element P1 includes, for example, a parasitic capacitance Cp1, a parasitic inductance Lp1 and a parasitic resistance Rp1 formed with a line connecting the drain of the second reference transistor M5 and the external terminal T1, bonding pads and bonding wires.

The second parasitic element P2 includes, for example, a parasitic inductance Lp2 and a parasitic resistance Rp2 formed with a line connecting the ground line inside the IC and the grounded terminal GND, bonding pads and bonding wires.

The operation of the oscillator circuit 100 will be explained in the followings.

The operation of the oscillator circuit 100 is basically same as that of the circuit 200. In the oscillator circuit 100, an inverting output signal of a common source amplifier circuit composed of the oscillating transistor M1 connected to the operational amplifier A1 and the first mirror transistor M2, is fed back to the non-inverting input (+) of the operational amplifier A1. Thus, it generally becomes a negative feedback. However, at the frequency in which the amplifier gain is greater than or equal to 0 dB and phase lag is 180 degree between the operational amplifier A1 and the common source amplifier circuit, the total phase lag becomes 360 degree. Thus, it becomes a positive feedback to cause an oscillation.

In the oscillator circuit 100, the drain current determined by the second reference transistor M5 and the external resistance $R_0$ is transmitted to the first current mirror circuit CM1 through the second current mirror circuit CM2, where a current proportional to the drain current of the second reference transistor M5 flows through the oscillating transistor M1. Therefore, by decreasing the external resistance $R_0$, the oscillation current flowing through the oscillating transistor M1 increases to increase the oscillation frequency. Conversely, by increasing the external resistance $R_0$, the oscillation current flowing through the oscillating transistor M1 decreases to decrease oscillation frequency.

As described above, in the oscillator circuit 100, the oscillation current flowing through the oscillating transistor M1 and the first mirror transistor M2 is adjusted by the external resistance $R_0$ via the second current mirror circuit CM2 and the first current mirror circuit CM1 to adjust the oscillation frequency. Therefore, the oscillation current does not flow through the parasitic elements P1 and P2. Thus, the upper limit for the oscillation can be increased.

Although it is described in the above embodiment that the oscillator circuit 100 includes two current mirror circuits, the oscillation circuit of the invention may include only the first current mirror circuit CM1, without the second current mirror circuit CM2, where the drain of the first reference transistor M3 is connected to the external terminal T1 and the other edges of the external resistor R0 is connected to the power line Vcc.

In addition, the oscillator circuit 100 may include a plurality of current mirror circuits, for example, more than three current mirror circuits.

In addition, although it is described in the above embodiment that the oscillating transistor M1 is a P-Channel-MOSFET, the oscillating transistor M1 may be a N-Channel-MOSFET. In such the case, the reference voltage Vref may be applied to the non-inverting input (+), same as explained for the oscillator circuit 200, and the connection point of the oscillating transistor and the first mirror transistor M2 may be connected to the inverting input (−) of the operational amplifier A1.

The oscillator circuit according to the present invention is applicable widely in various oscillator circuits including the external resistor for adjusting the frequency thereof. For example, the oscillator circuit may be fabricated in high frequency superposition modules used in driving circuit of laser diode for optical pickups to read information on the optical disks such as DVDs and MDs. The high frequency superposition modules are used to reduce laser noises by superposing a high frequency current of several hundred MHz on a driving current of laser diode.

It is apparent that the present invention is not limited to the above embodiment, that may be modified and changed without departing from the scope and spirit of the invention.

What is claimed is:

1. An oscillator circuit comprising:
    an oscillator including an oscillating transistor through which an oscillating current flows; and
    a current mirror circuit via which said oscillating current is adjusted by a resistance consisting of an external resistor to adjust an oscillating frequency of said oscillator,
    wherein said current mirror circuit comprises:
    a first reference transistor through which a current adjusted by said external resistor flows;
    a first mirror transistor connected to said oscillating transistor in series such that an output signal from said oscillating transistor is fed back to said oscillator therethrough; wherein the gate of said first reference transistor and the gate of said first mirror transistor are connected with each other; and
    a second current mirror circuit including a second reference transistor, a parasitic element connected to said second reference transistor in series, and a second mirror transistor,
    wherein said second mirror transistor is connected to said first reference transistor in series.

2. An oscillator circuit comprising:
    an oscillator including an oscillating transistor through which an oscillating current flows; and
    a current mirror circuit via which said oscillating current is adjusted by a resistance consisting of an external resistor to adjust an oscillating frequency of said oscillator,
    wherein said current mirror circuit includes:
    a first reference transistor through which a current adjusted by said external resistor flows;
    a parasitic element connected to said first reference transistor in series; and
    a first mirror transistor connected to said oscillating transistor in series such that an output signal from said oscillating transistor is fed back to said oscillator therethrough; wherein the gate of said first reference transistor and the gate of said first mirror transistor are connected with each other.

3. The oscillator circuit as set forth in claim 1, wherein said current mirror circuit includes:
    a first reference transistor where the source/drain of which is grounded and the drain/source and the gate of which are connected in common to said gate of said first mirror transistor; and
    a first mirror transistor where the source/drain of which is grounded and the drain/source of which is connected to said oscillating transistor in series such that an output signal from said oscillating transistor is fed back to said oscillator therethrough.

4. An oscillator circuit comprising:
    an oscillator including an oscillating transistor through which an oscillating current flows;
    a first mirror transistor where the source/drain of which is grounded and the drain/source of which is connected to said oscillating transistor in series;
    a first reference transistor where the source/drain of which is grounded and the drain/source and the gate of which are connected in common to said gate of said first mirror transistor;
    a second mirror transistor where the source of which is connected to a power line and the drain/source of which is connected to said drain/source of said first reference transistor; and
    a second reference transistor where the source/drain of which is connected to said power line, the drain/source and the gate of which are connected in common to said gate of said second mirror transistor and the drain/source of which is connected in series to a parasitic element which is connected to an external terminal to which a resistance consisting of an external resistor is connected;
    wherein said oscillating current is adjusted by adjusting a current flow through said external resistor and said second reference transistor.

5. An oscillating circuit comprising:
    an oscillator comprising:
    an operational amplifier having a first input terminal to which a reference voltage is input and a second input terminal, and
    an oscillating transistor which oscillates an oscillating current, wherein an output from said operational amplifier is input to the gate of said oscillating transistor and an output form the source/drain of said oscillating transistor is input to said second terminal of said operational amplifier; and
    a first current mirror circuit comprising:
    a first reference transistor through which a first current adjusted by the resistance value of an external resistor flows, and
    a first mirror transistor through which a second current adjusted by said first current flows, said first mirror transistor being connected to said source/drain of said oscillating transistor in series between a power line and a ground line,
    wherein the oscillating frequency of said oscillator is adjusted by having said first mirror transistor function as a resistance to adjust said oscillating current by flowing said second current to said first mirror transistor.

6. The oscillator circuit as set forth in claim 5 further comprising a second current mirror circuit, said second current mirror circuit comprising:
    a second reference transistor through which a third current flows and connected to said external resistor in series between a power line and a ground line, said first current being adjusted by said third current/ and
    a second mirror transistor, said second mirror transistor being connected to said first reference transistor in series between a power line and a ground line.

7. The oscillator circuit as set forth in claim 6 further comprising a parasitic element connected to said second reference transistor in series.

8. The oscillator circuit as set forth in claim 5 further comprising a parasitic element connected to said second reference transistor in series.

* * * * *